(12) United States Patent
Chen et al.

(10) Patent No.: US 12,406,892 B2
(45) Date of Patent: Sep. 2, 2025

(54) DISPLAY DEFECT MONITORING STRUCTURE

(71) Applicant: Taiwan Semiconductor Manufacturing Company, Ltd., Hsinchu (TW)

(72) Inventors: Chu Fu Chen, Hsinchu (TW); Chun Hao Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 427 days.

(21) Appl. No.: 18/171,286

(22) Filed: Feb. 17, 2023

(65) Prior Publication Data

US 2024/0087966 A1    Mar. 14, 2024

Related U.S. Application Data

(60) Provisional application No. 63/375,536, filed on Sep. 13, 2022.

(51) Int. Cl.
| | |
|---|---|
| *H10K 59/131* | (2023.01) |
| *H01L 21/66* | (2006.01) |
| *H10B 10/00* | (2023.01) |
| *H10K 59/12* | (2023.01) |
| *H10K 59/127* | (2023.01) |

(52) U.S. Cl.
CPC ............ *H01L 22/30* (2013.01); *H01L 22/12* (2013.01); *H01L 22/14* (2013.01); *H10B 10/12* (2023.02); *H10K 59/1201* (2023.02); *H10K 59/127* (2023.02); *H10K 59/131* (2023.02)

(58) Field of Classification Search
CPC ................... H10K 59/131; H10K 59/1201
See application file for complete search history.

(56) References Cited

U.S. PATENT DOCUMENTS

| | | | |
|---|---|---|---|
| 2016/0181257 A1* | 6/2016 | Liaw | H10D 30/6211 257/401 |
| 2016/0247436 A1* | 8/2016 | Lee | G09G 3/2003 |
| 2020/0020281 A1* | 1/2020 | Hyun | G01R 27/205 |

* cited by examiner

*Primary Examiner* — Douglas M Menz
(74) *Attorney, Agent, or Firm* — KILPATRICK TOWNSEND & STOCKTON LLP

(57) ABSTRACT

A driver structure for an organic light-emitting diode (OLED) device is provided. The driver structure includes a front-end-of-line (FEOL) layer; a back-end-of-line (BEOL) layer disposed on the FEOL layer; and a customer BEOL layer disposed on the BEOL layer. The BEOL layer includes a customer BEOL electrical checking structure. The customer BEOL electrical checking structure has a plurality of memory cells that include a first memory cell vertically aligned with and corresponds to two adjacent pixel regions. The customer BEOL layer includes six bottom structures corresponding to the two adjacent pixel regions and connected in series to form a first electrical path and a second electrical path each electrically connected to the first memory cell. The first memory cell is configured to detect an anomaly of electrical resistance of the first and second electrical path.

20 Claims, 10 Drawing Sheets

DISPLAY DEFECT MONITORING STRUCTURE

FIELD

Embodiments of the present disclosure relate generally to display devices, and more particularly to organic light emitting diode (OLED) devices.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
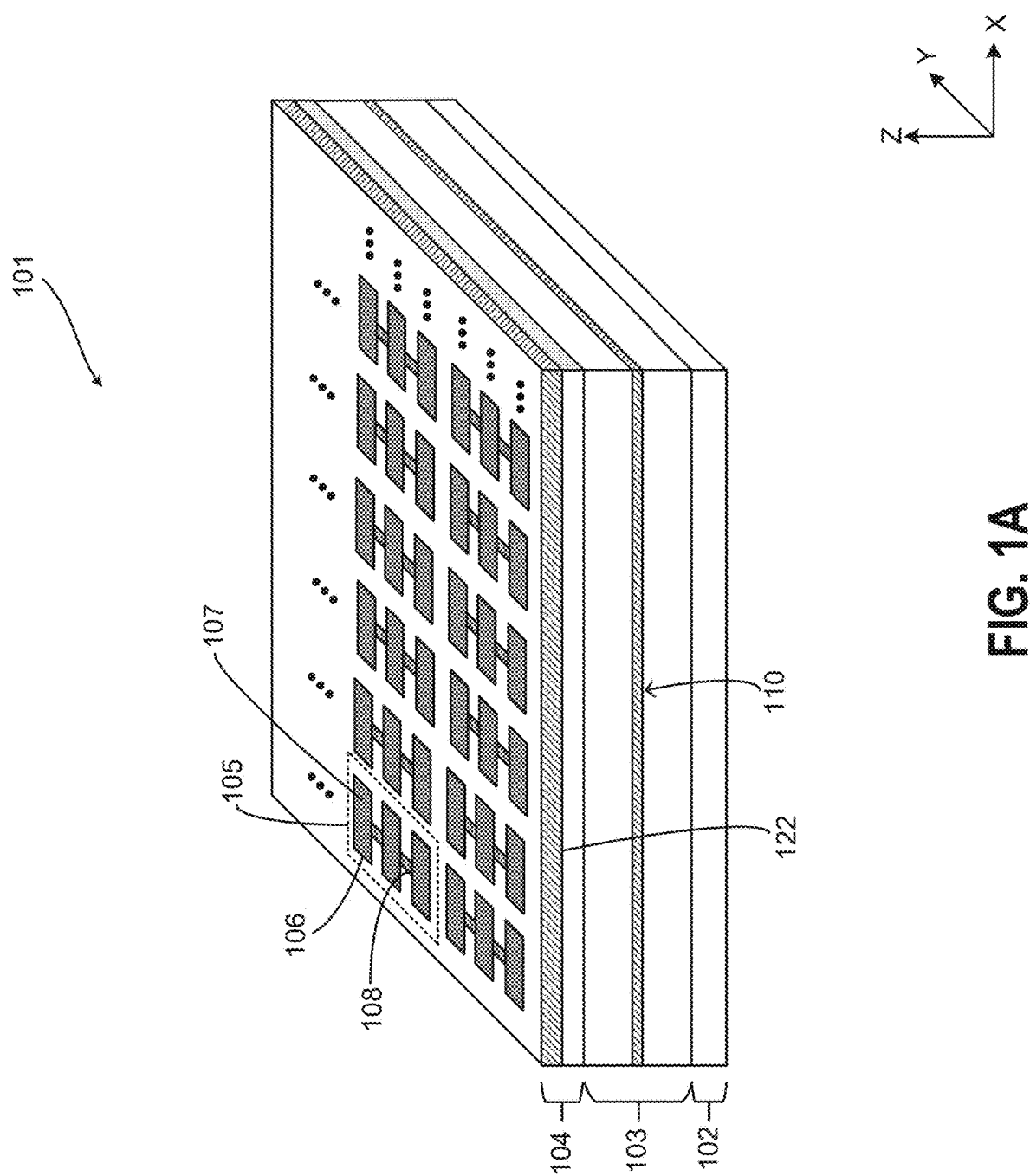
FIG. 1A is a schematic diagram illustrating an example driver structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Smart glasses such as virtual reality (VR) displays and augmented reality (AR) displays are useful in various applications, in both industrial and consumer contexts, including near eye display (NED) devices, industrial VR displaying devices, VR training simulators, remote control robotics, equipment repair and assembly devices, warehouse inventory management devices, AR/VR gaming devices, smartphone accessories, 3D movie displays, smart glasses, and outdoor activity monitors.

AR/VR displays are typically based on organic light emitting diodes (OLEDs). An organic light emitting diode (OLED) is a light-emitting diode that includes an emissive electroluminescent layer comprising an organic compound that emits light in response to an electric current. Thus, when a current is passed through the OLED, the emissive layer emits light. An array of such OLEDs can be formed with different organic compounds at different respective positions in the array to generate different colors (e.g., red, blue, and green) at those respective positions. Thus, by providing suitable currents to the various OLEDs of the array, a digital image made up of the underlying regions of the different colors can be generated.

OLED displays are required to have pixel arrays in a high display (HD) resolution for AR/VR applications. For example, an HD OLED display may have 1920 pixels in height and 1080 pixels in width (1920×1080 pixels). Due to the high-resolution requirement, the OLED display mandates a premium quality and a strictly low level (e.g., ppm) of the overall pixel defects. As one example, for an OLED display having 1920×1080 pixels, the number of defective pixels should be no more than 2 (e.g., about 1 ppm).

Manufacturing of OLED display devices (sometimes also referred to as "OLED devices") is a relatively long and time-consuming process. In some implementations, a process for manufacturing OLED devices includes three major steps. First, a front-end-of-line (FEOL) layer is fabricated to form control transistors on a wafer. Fabrication of the FEOL layer typically takes about 3 months. Second, a back-end-of-line (BEOL) layer is fabricated and disposed on the FEOL layer. The BEOL layer may include an interconnecting structure and an OLED base layer (sometimes also referred to as "OLED bottom layer"), and fabrication of the BEOL layer typically takes about 1-2 months. Third, an OLED major structure is fabricated and disposed on the BEOL layer. Fabrication of the OLED major structure typically takes about 1-2 months. Thus, the overall time for manufacturing OLED devices may be as long as 5-7 months. Because of the long cycle time, it is desirable to detect defects and assure the quality of the BEOL layer at a relatively early stage of manufacture in an efficient and reliable manner. If defects generated in the BEOL process could not be identified timely and are carried into the subsequent step of disposing the OLED major structure, it may cause a significant loss of money and time to market.

Two methods have been used to detect the defects in the manufacturing of OLED devices. One method is based on the measurement of a portion of pixels of an OLED device, e.g., through a "via chain" that interconnects the selected OLED pixels. If one OLED pixel is defective, an increased electrical resistance will be detected when measuring the entire via chain. In practice, this method is often used to measure only a small representative area of the OLED device in a process control module (PCM). However, it would require an ultra-long time (e.g., about 9 hours or more) for testing the whole area of the entire OLED device. Thus, this method is less efficient in monitoring the OLED devices for AR/VR display application, which requires high display definition and a ppm level of defective pixels. In addition, this method has relatively low sensitivity (because tens or hundreds of OLED pixels in the "via chain" are monitored) and is less reliable for the measurement of high electrical resistance. In other words, this method lacks the capability to monitor a single pixel and thus could not precisely identify the number and location of the defective pixels in the OLED device.

Another method for detecting OLED pixel defects is based on optical testing. For example, commercial optical systems could be used to scan the whole area of the OLED device and compare it with a standard or reference pattern to identify a defect in the scanned area, optionally with the assistance of artificial intelligence (AI) technologies. However, this method is less efficient in monitoring the OLED devices for AR/VR application, in part due to the insufficient throughput of the optical measurement, the strict requirement on display definition, the large number of pixels, and the overall complex structure of the OLED devices. In addition, unlike electrical measurement, optical measurement is much less effective in detecting and determining a physical defect that is not exposed on a top surface (e.g., in the BEOL layer under the OLED major structure) and may not produce reliable testing results.

Therefore, it is desirable for a fast, efficient, and reliable method for testing or monitoring individual pixels and detecting anomalies in individual pixel regions during the manufacturing of OLED devices.

In accordance with some aspects of the disclosure, novel driver structures for OLED devices and methods for detecting anomalies in pixel regions of OLED devices are provided. In some embodiments, a driver structure for an OLED device includes a FEOL layer, a BEOL layer disposed on the FEOL layer, a customer BEOL layer disposed on the BEOL layer, and a customer BEOL electrical checking structure or mechanism configured to inspect the customer BEOL layer and detect an anomaly in the pixel regions of the customer BEOL layer during manufacturing of the OLED devices.

The driver structure provides at least the following advantages. First, it allows for detecting defective pixel regions in the customer BEOL layer before the OLED major structure is fabricated and disposed on the driver structure, which can assure the quality of the driver structure at an early stage of the manufacturing of OLED devices.

Second, the customer BEOL electrical checking structure includes a static random access memory (SRAM) cell array, which further includes multiple memory cells corresponding to each pixel region. Therefore, every single pixel region of the customer BEOL layer can be inspected, and the number and location of the defective pixel regions could be determined accurately. In addition, millions of pixel regions (e.g., for an OLED device having high definition) can be inspected by utilizing various SRAM testing technologies (e.g., by scanning word lines quickly), which significantly improves the time efficiency when testing the entire area of the customer BEOL layer. Further, the present driver structure has improved sensitivity and enables reliable measurement of high electrical resistances. Moreover, fabrication and implementation of the SRAM cell array into the driver structure can be integrated into the fabrication of the BEOL layer, which is manufacturing-feasible and cost-efficient.

Third, the driver structure of the present disclosure can be implemented in either a PCM or selected representative chip areas of a wafer during the manufacturing of the OLED devices, and the inspection of the entire production chip areas of the wafer can be significantly more efficient as compared with the traditional methods.

Driver Structure and OLED Device

Figure 1B:
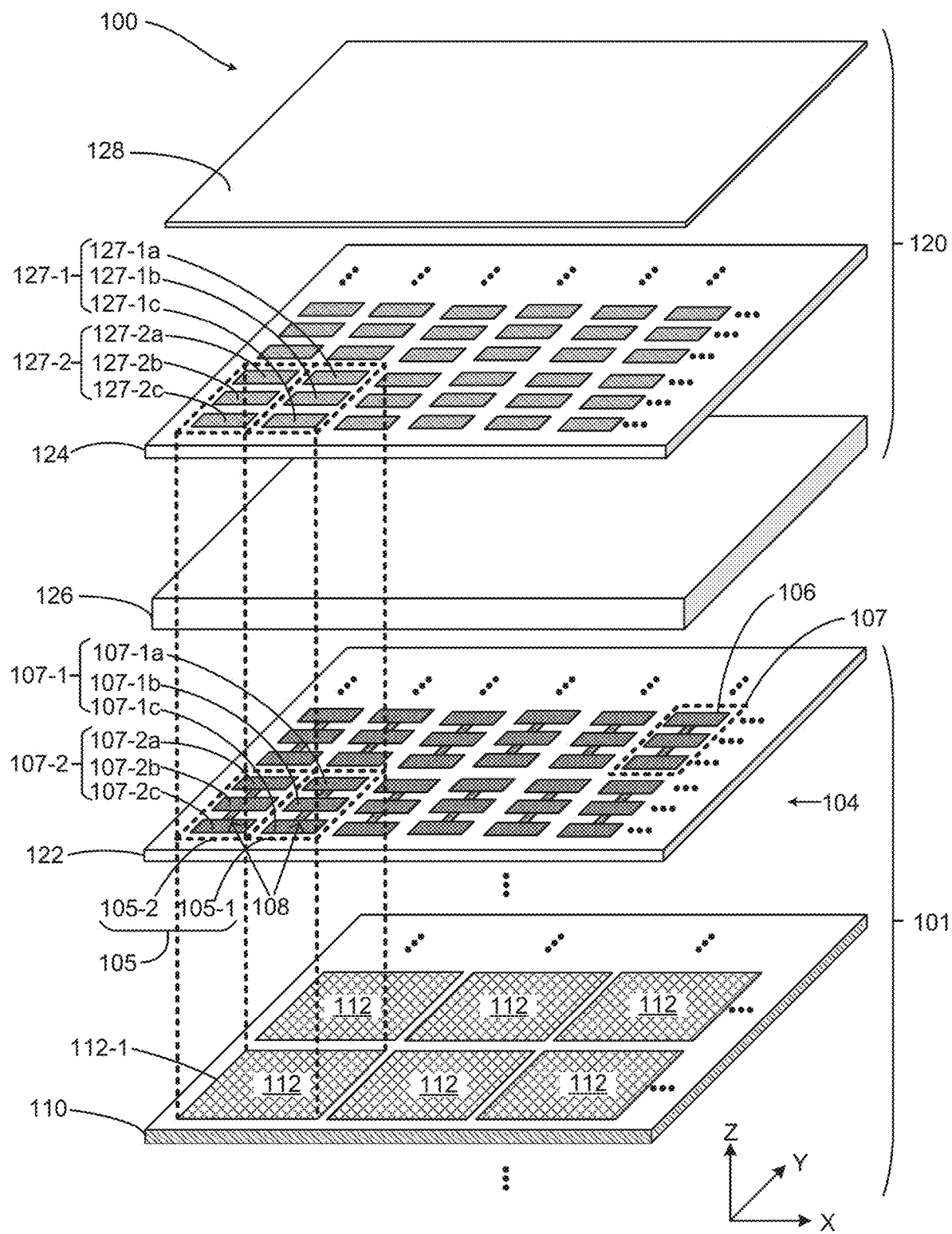
FIG. 1B is a schematic diagram illustrating an example OLED device in accordance with some embodiments.
Figures 1C, 1D:
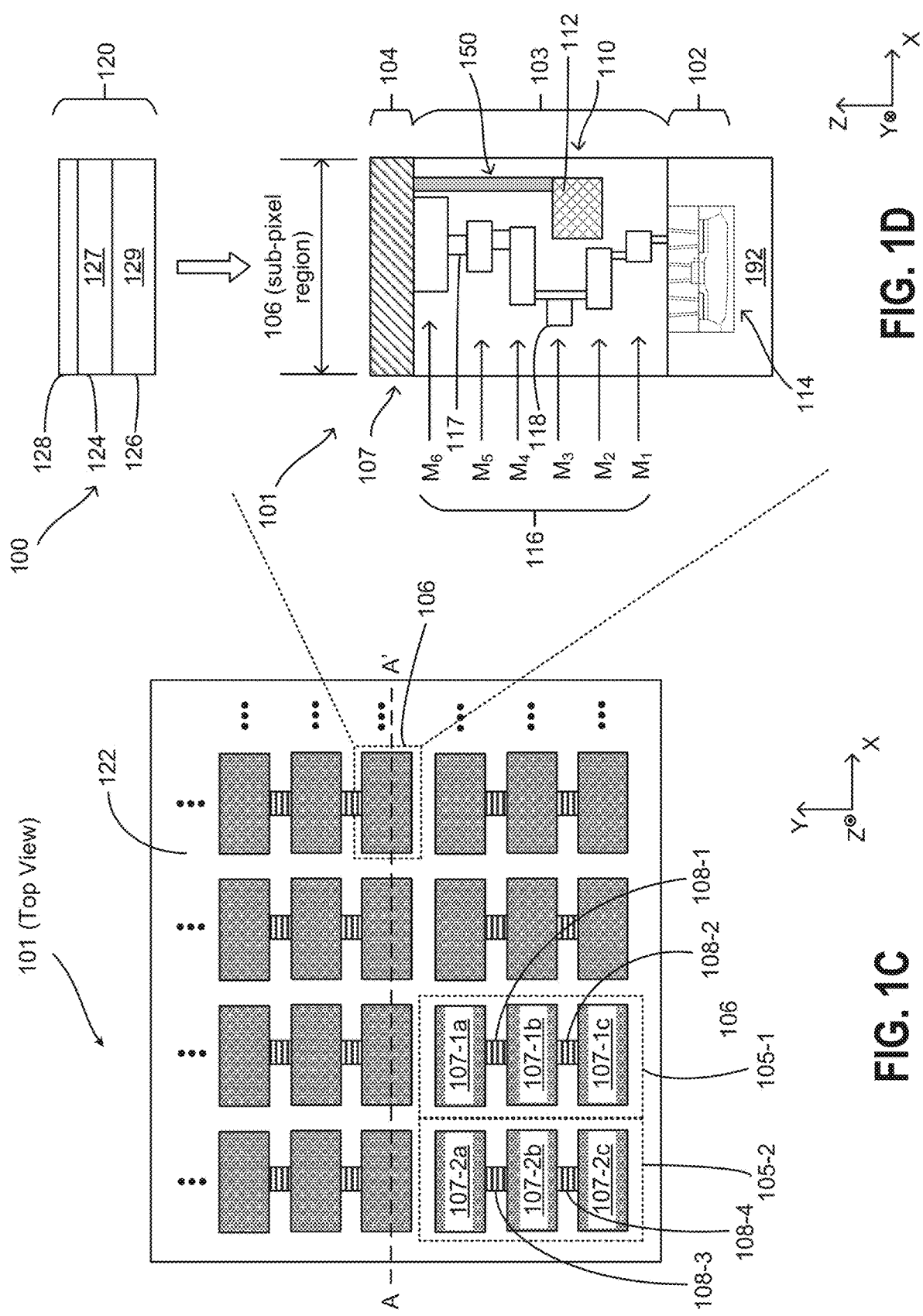
FIG. 1C is a schematic diagram illustrating a top view of the driver structure of FIG. 1A in accordance with some embodiments.
FIG. 1D is a schematic diagram illustrating a cross-sectional view of a sub-pixel region along the line A-A' of FIG. 1C in accordance with some embodiments.

Now referring to FIGS. 1A-1D, examples of semiconductor devices and various components thereof will be illustrated and described. FIG. 1A is a schematic diagram illustrating an example of driver structure 101 in accordance with some embodiments. FIG. 1B is a schematic diagram illustrating an example OLED device 100 including the driver structure 101 in accordance with some embodiments. FIG. 1C is a schematic diagram illustrating a top view of the driver structure 101 of FIG. 1A in accordance with some embodiments. FIG. 1D is a schematic diagram illustrating a cross-sectional view of a sub-pixel region 106 along the line A-A' of FIG. 1C in accordance with some embodiments. It should be understood that the semiconductor devices and various components thereof are exemplary rather than limiting. One of ordinary skill in the art would recognize many variations, modifications, and alternatives within the contemplation of the present disclosure. It should also be understood that FIGS. 1A-1D are not drawn to scale.

In the illustrated example of FIGS. 1A-1D, the driver structure 101 is a semiconductor device configured to serve as a base to support an OLED major structure 120 (FIG. shown in FIG. 1D) to be disposed thereon. Once the OLED major structure 120 is disposed on the driver structure 101, an OLED device 100 is thereby formed. The driver structure 101 is further configured to provide power and drive the formed OLED device 100. In some embodiments, the driver structure 101 has a multilayer configuration including a FEOL layer 102, a BEOL layer 103 disposed on the FEOL layer 102, and a customer BEOL layer 104 disposed on the BEOL layer 103.

The driver structure 101 includes multiple pixel regions 105 arranged in rows (e.g., the X-direction shown in FIG. 1A) and columns (e.g., the Y-direction shown in FIG. 1A). In some embodiments, the driver structure 101 has a high definition (HD) with 1920×1080 pixel regions. In alternative embodiments, the driver structure 101 has ultra-high-definition (UHD), such as 4K UHD (3840×2160 pixel regions) and 8K UHD (7680×4320 pixels regions). In some embodiments, the driver structure 101 has a pixel density of at least 3000 pixels per inch (PPI) and an alignment error of less than 0.5 microns. In some embodiments, each of the pixel regions 105 of the driver structure 101 further includes three sub-pixel regions 106 corresponding to the RGB colors (i.e., a red color, a green color, and a blue color), respectively. In some embodiments, the three sub-pixel regions 106 are straightly aligned in either the X-direction or the Y-direction within each of the corresponding pixel regions 105.

The FEOL layer includes multiple control transistors (e.g., the control transistor 114 shown in FIG. 1D). Each control transistor 114 corresponds to one of the sub-pixel regions 106. Thus, one pixel region 105 may correspond to three control transistors 114. Details of the control transistors 114 will be described below. The BEOL layer includes a multilayer interconnect (MLI) structure 116. In some embodiments, the customer BEOL layer 104 includes an OLED bottom layer 122. The OLED bottom layer 122 further includes multiple OLED bottom structures 107 arranged in rows and columns in the X-Y plane. Each OLED bottom structure 107 is aligned with and corresponds to one of the sub-pixel regions 106. Thus, each one of the pixel regions 105 may correspond to three sub-pixel regions 106, three OLED bottom structures 107, and three control transistors 114. The MLI structure 116 of the BEOL layer 103 is configured to electrically connect the control transistor 114 and the corresponding OLED bottom structure 107 with respect to each sub-pixel region 106. Details of the control transistors 114 and the MLI structure 116 will be described below.

As shown in FIG. 1A, the BEOL layer 103 further includes a customer BEOL electrical checking structure (sometimes also referred to as "customer BEOL electrical checking mechanism) 110. The customer BEOL electrical checking structure 110 is configured to monitor the quality and detect an anomaly of the customer BEOL layer 104 (e.g., anomalies in the pixel regions 105). In some embodiments, the customer BEOL electrical checking structure 110 may be used to identify and determine the defective pixel regions at an early stage in the manufacturing of the OLED device 100, e.g., before the OLED major structure 120 is disposed on the driver structure 101, thereby ascertaining the quality of the intermediate products and mitigating the overall risk of product failure.

As shown in FIG. 1B, an example OLED device 100 includes the driver structure 101 and an OLED major structure 120 to be disposed on a front surface of the customer BEOL layer 104. The OLED major structure 120 includes, among other components, an OLED top layer 124, an OLED middle layer 126, and a glass layer 128. In some implementations, the OLED major structure 120 and the driver structure 101 are fabricated by the same manufacturer. The OLED major structure 120 is subsequently disposed on the customer BEOL layer 104. In other implementations, the OLED major structure 120 may be fabricated and disposed on the driver structure 101 by a manufacturer different from the manufacturer of the driver structure 101.

As shown in FIG. 1B, the customer BEOL electrical checking structure 110 includes a static random access memory (SRAM) cell array including multiple memory cells 112 arranged in multiple rows and columns in the X-Y plane. Each memory cell 112 is dimensionally comparable to and vertically aligned with two adjacent pixel regions 105 in the Z-direction. In other words, the area of each memory cell 112 in the horizontal plane (i.e., the X-Y plane shown in FIG. 1B) is comparable to the area of two adjacent pixel regions 105 in the Z-direction in the X-Y plane. In one example, the area of each memory cell 112 in the X-Y plane deviates from the area of two adjacent pixel regions 105 by less than 5%. In another example, the area of each memory cell 112 in the X-Y plane deviates from the area of two adjacent pixel regions 105 by less than 2%. In yet another example, the area of each memory cell 112 in the X-Y plane deviates from the area of two adjacent pixel regions 105 by less than 1%. In still another example, the area of each memory cell 112 in the X-Y plane deviates from the area of two adjacent pixel regions 105 by less than 0.5%.

As an example, a first memory cell 112-1 is one of the memory cells 112. The first memory cell 112-1 is dimensionally comparable to and vertically aligned with the corresponding pixel regions 105-1 and 105-2, which are adjacent to each other and aligned in the X-direction in the example shown in FIG. 1B.

As discussed above, each one of the pixel regions 105 corresponds to three OLED bottom structures 107. As one example, a first OLED bottom structure 107-1a, a second OLED bottom structure 107-1b, and a third OLED bottom structure 107-1c (collectively as 107-1) are included in the first pixel region 105-1 and aligned in the Y-direction. In some embodiments, the three OLED bottom structures 107-1a, 107-1b, and 107-1c correspond to a red color, a green color, and a blue color, respectively. Likewise, a fourth OLED bottom structure 107-2a, a fifth OLED bottom structure 107-2b, and a sixth OLED bottom structure 107-2c (collectively as 107-2) are included in the second pixel region 105-2 and aligned in the Y-direction. Thus, each of the memory cells 112 (e.g., the first memory cell 112-1) corresponds to six OLED bottom structures (e.g., 107-1a, 107-1b, 107-1c, 107-2a, 107-2b, and 107-2c) within the two adjacent pixel regions. Accordingly, each of the memory cells 112 can be used to identify an anomaly of six OLED bottom structures in the customer BEOL layer 104 within the two adjacent pixel regions 105-1 and 105-2. It should be understood that the configuration of FIG. 1B is for illustrative purposes and not intended to be limiting, and other configurations are also possible. For example, the memory cells 112 may be in any shape and dimension, provided that they are dimensionally comparable to and vertically aligned with the adjacent pixel regions 105-1 and 105-2.

In some embodiments, the customer BEOL layer 104 further includes multiple vias 108 arranged in rows and columns in the X-Y plane. The vias 108 are configured and arranged to electrically interconnect the three OLED bottom structures within each pixel region 105 to form an electrical path. In some embodiments, the vias 108 includes a conductive material such as indium tin oxide (ITO). As shown in the example of FIG. 1C, in the pixel region 105-1, a first via 108-1 electrically connects the first OLED bottom structure 107-1a and the second OLED bottom structure 107-1b, and a second via 108-2 electrically connects the second OLED bottom structure 107-1b and the third OLED bottom structure 107-1c. Similarly in the pixel region 105-2 adjacent to the pixel region 105-1, a third via 108-3 electrically connects the fourth OLED bottom structure 107-2a and the fifth OLED bottom structure 107-2b, and a fourth via 108-4 electrically connects the fifth OLED bottom structures 107-2b and the sixth OLED bottom structure 107-2c.

The OLED top layer 124 includes multiple OLED top structures 127 (e.g., 127-1 and 127-2) arranged in rows and columns in the X-Y plane. The OLED top structures 127-1 and 127-2 respectively correspond to the first pixel region 105-1 and the second pixel region 105-2. Accordingly, the OLED top structures 127-1 and 127-2 are vertically aligned with the corresponding OLED bottom structures 107-1 and 107-2, respectively. In the example of FIG. 1B, the three OLED top structures 127-1a, 127-1b, and 127-1c are respectively aligned with the three OLED bottom structures 107-1a, 107-1b, and 107-1c in the pixel region 105-1. Likewise, the three OLED top structures 127-2a, 127-2b, and 127-2c are respectively aligned with the three OLED bottom structures 107-2a, 107-2b, and 107-2c in the pixel region 105-2 adjacent to the pixel region 105-1. Accordingly, the first memory cell 112-1 is vertically aligned with the OLED bottom structures 107-1 and 107-2 and the OLED top structures 127-1 and 127-2 in the two adjacent pixel regions 105-1 and 105-2.

FIG. 1D illustrates a cross-sectional view of the structure of the OLED device 100 in a sub-pixel region 106 along the line A-A' shown in FIG. 1C. As mentioned above, once the OLED major structure 120 is disposed on and electrically connected to the driver structure 101, the OLED device 100 will be formed. In the sub-pixel region 106, the driver structure 101 includes, among other components, a control transistor 114 in the FEOL layer 102, an MLI structure 116 in the BEOL layer 103, and an OLED bottom structure 107 in the customer BEOL layer 104. The control transistor 114 may be disposed on a substrate 192. The control transistor 114 is electrically connected to the OLED bottom structure 107 through the MLI structure 116 and is configured to provide a current source to drive and control the OLED device 100 to be formed.

In some embodiments, the control transistor 114 is a transistor fabricated using FEOL processes on, for example, a silicon substrate. In other words, the control transistor 114 is a silicon-based transistor. In some examples, the control transistor 114 is a fin field-effect transistor (FinFET). In other examples, the control transistor 114 is a gate-all-around (GAA) field-effect transistor (FET). In yet other examples, the control transistor 114 is a multi-bridge channel (MBC) field-effect transistor (FET). It should be understood that these examples are not intended to be limiting and other types of transistors may be employed as well. When the control transistor 114 is turned on by applying an appropriate voltage to the gate of the control transistor 114, the control transistor 114 is turned on. The current provided by the control transistor 114 can be tuned by applying different voltages to the drain of the control transistor 114. The tuned current provided by the control transistor 114 is used to control the OLED device formed in the corresponding sub-pixel region 106.

The MLI structure 116 includes a combination of dielectric layers and conductive layers configured to form various interconnect structures. The conductive layers are configured to form vertical interconnect features 117 (e.g., device-level contacts, vias, etc.) and horizontal interconnect features 118 (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 116. In the example shown in FIG. 1D, the MLI structure 116 includes, from a back side to a front side of the BEOL layer 103, the first metal layer M1, the second metal layer M2, the third metal layer M3, the fourth metal layer M4, the fifth metal layer M5, and the sixth metal layer M6. It should be understood that although the MLI structure 116 is depicted in FIG. 1D with a given number of dielectric layers and conductive layers, the present disclosure contemplates MLI structures 116 having more or fewer dielectric layers and/or conductive layers depending on design requirements of the driver structure 101.

Figure 2:
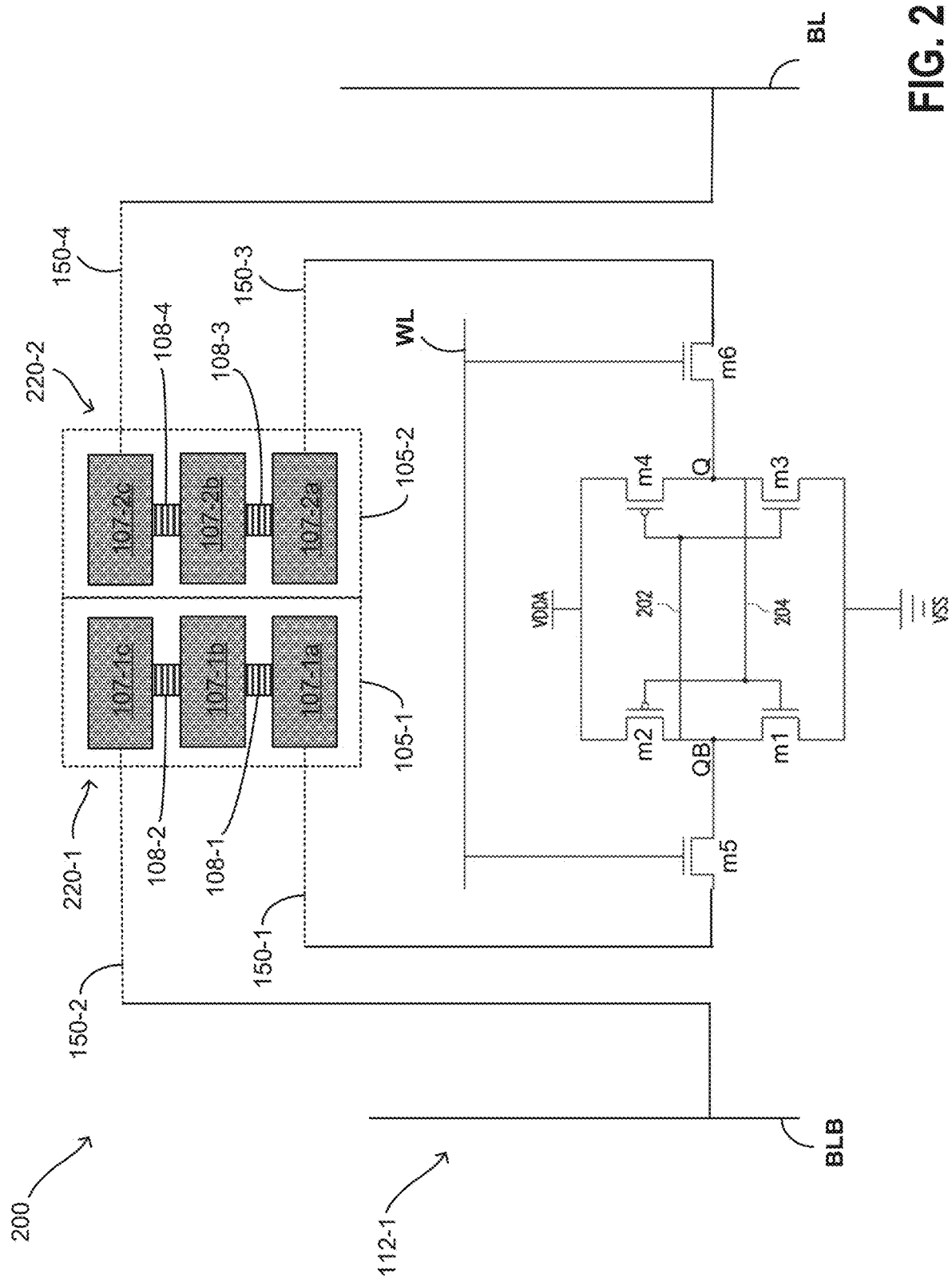
FIG. 2 is a schematic diagram illustrating an example anomaly-detecting system in accordance with some embodiments.

In some embodiments, the customer BEOL electrical checking structure 110 and the memory cells 112 thereof are located in the second metal layer M2 and the third metal layer M3 of the MLI structure 116. For example, the memory cell 112 corresponds to a word line (denoted as "WL" as shown in FIG. 2), a bit line (denoted as "BL" as shown in FIG. 2), and a complementary bit line (denoted as "bit line bar" or "BLB" as shown in FIG. 2). In some embodiments, the WL is located in the second metal layer M2, and the BL and BLB are located in the third metal layer M3, respectively. In alternative embodiments, the memory cell 112 may be located in other metal layers of the MLI structure 116 without limitation. The memory cells 112 are electrically connected to the corresponding OLED bottom structures 107 through multiple routing connections 150.

As mentioned above, the OLED major structure 120 to be disposed on to the driver structure 101 includes, among other components, the OLED top layer 124, the OLED middle layer 126, and the glass layer 128. The OLED middle layer 126 is disposed between the OLED bottom layer 122 and the OLED top layer 124, thereby forming a "sandwiched" structure of the OLED device 100. The glass layer 128 is disposed on the OLED top layer 124. The OLED top layer 124 includes multiple OLED top structures 127 arranged in rows and columns in the X-Y plane. As mentioned above, each OLED top structure 127 is aligned with the corresponding OLED bottom structure 107 in the sub-pixel region 106. The OLED top structure 127 and the OLED bottom structure 107 may each include an electrode (e.g., cathode or anode). In some embodiments, the OLED bottom structure 107 includes an anode, and the OLED top structure 127 includes a cathode. In order for the light to escape from the OLED device 100, at least one of the electrodes is transparent.

The OLED middle layer 126 includes at least one light emitting material 129 sandwiched between the OLED top structure 127 and the OLED bottom structure 107 in the sub-pixel region 106. The light emitting material 129 may include organic molecules, which are electrically conductive as a result of delocalization of pi electrons caused by conjugation over part or all of the molecule. The color of the light emitted from the OLED device 100 is determined by the type of the organic molecules used. In some embodiments, the OLED device 100 is based on small-molecule OLED (SM-OLED), and the light emitting material 129 used includes small molecules such as organometallic chelates, fluorescent and phosphorescent dyes, and conjugated dendrimers. The production of SM-OLEDs often involves thermal evaporation in a vacuum, which enables the formation of well-controlled and homogeneous films, and the construction of complex multi-layer structures. In other embodiments, the OLED device 100 is based on a polymer light-emitting diode (PLED or P-OLED), and the light emitting material 129 used includes an electroluminescent conductive polymer that emits light when connected to an external voltage. Unlike SM-OLEDs, thermal evaporation in a vacuum is not needed. Polymers can be processed in solution, and spin coating is often used for depositing thin polymer films. P-OLEDs are quite efficient and require a relatively small amount of power for the amount of light produced.

In some embodiments, the OLED device 100 further includes additional layers (not shown) disposed between the OLED top layer 124 and the OLED bottom layer 122. The additional layers include but are not limited to a polarizer layer, a hole injection layer, a hole transport layer, an electron transporting layer, a hole blocking layer, or other functional layers.

Now referring to FIG. 2, an example anomaly-detecting system 200 (i.e., a "system for monitoring and detecting an anomaly in a driver structure," a "system," or a "unit") will be illustrated and described. FIG. 2 is a schematic diagram illustrating the configuration of the system 200. In the illustrated example, an anomaly-detecting system 200 includes, among other components, one of the memory cells 112 (e.g., the first memory cell 112-1), the corresponding OLED bottom structures 107-1a, 107-1b, and 107-1c (collectively as 107-1) of the first pixel region 105-1, the corresponding OLED bottom structures 107-2a, 107-2b, and 107-2c (collectively as 107-2) of the second pixel region 105-2, the vias 108-1, 108-2, 108-3, and 108-4 (collectively as 108), and the routing connections 150-1, 150-2, 150-3, and 150-4 (collectively as 150). The system 200 is dimensionally comparable to and positionally aligned with the two adjacent pixel regions 105-1 and 105-2. Accordingly, the driver structure 101 may have multiple systems 200 arranged in rows and columns in the X-Y plane. In some embodiments, for a particular driver structure 101 having a given number of pixel regions 105, the number of the system 200 is half of the number of the pixel regions 105, such that every two adjacent pixel regions (e.g., 105-1 and 105-2) can be monitored by one single system 200.

In some embodiments, the memory cell 112 includes but is not limited to a six-transistor (6T) SRAM structure. In some embodiments, more or fewer than six transistors may be used to implement the memory cell 112. In one example, the memory cell 112 may use an eight-transistor (8T) SRAM structure. In yet another example, the memory cell 112 may use a ten-transistor (10T) SRAM structure. The memory cell 112 includes a first inverter formed by an n-channel metal-oxide-semiconductor (NMOS)/p-channel metal-oxide-semiconductor (PMOS) (hereinafter "NMOS/PMOS") transistor pair m1 and m2, a second inverter formed by an NMOS/PMOS transistor pair m3 and m4, and access transistors m5 and m6. In the example shown in FIG. 2, transistors m1, m3, m5, and m6 include NMOS transistors, and transistors m2 and m4 include PMOS transistor.

The first and second inverters are cross-coupled to each other via cross-coupling lines 202 and 204 to form a latching circuit for data storage. For example, the cross-coupling line 202 is coupled between the second terminals of the first inverter transistor pair, e.g., m1 and m2, and the gates of the second inverter transistor pair, e.g., m3 and m4. Similarly, the cross-coupling line 204 is coupled between the second terminals of the second inverter transistor pair, e.g., m3 and m4, and the gates of the first inverter transistor pair, e.g., m1 and m2. As such, the output of the first inverter at the node Qbar (i.e., "QB") is coupled to the input of the second inverter, and the output of the second inverter at the node Q is coupled to the input of the first inverter. Power is supplied to each of the inverters, for example, a first terminal of each of transistors m2 and m4 is coupled to an array power supply voltage (VDDA) on a power supply terminal, while a first terminal of each of transistors m1 and m3 is coupled to a reference voltage (VSS), for example, ground. A bit of data is stored in the memory cell 112 as a voltage level at the node Q and can be read by circuitry via the bit line (BL). Access to the node Q is controlled by the access transistor m6. The node QB stores the complement to value at Q, e.g., if Q is "logical high," QB will be "logical low," and access to Qbar is controlled by the access transistor m5.

A gate of the access transistor m6 is coupled to the WL. A first source/drain of the access transistor m6 is coupled to the BL, and a second source/drain terminal of the access transistor m6 is coupled to second terminals of transistors m4 and m3 at the node Q. Similarly, a gate of the access transistor m5 is coupled to the WL. A first source/drain terminal of the access transistor m5 is coupled to the BLB, and a second source/drain terminal of the access transistor m5 is coupled to second terminals of transistors m2 and m1 at the node Qbar (i.e., "QB").

In the illustrated example of FIG. 2, the system 200 includes the first memory cell 112-1 electrically connected to the corresponding OLED bottom structures 107-1 and 107-2, respectively. The first memory cell 112-1 corresponds to the word line (WL), the bit line (BL), and the complementary bit line (BLB). In one example, the first OLED bottom structure 107-1a of the first pixel region 105-1 is connected to a first access transistor m5 of the first memory cell 112-1, through the first routing connection 150-1. The third OLED bottom structure 107-1c of the first pixel region 105-1 is connected to the complementary bit line (BLB), through the second routing connection 150-2. Further, the first via 108-1 electrically connects the first OLED bottom structure 107-1a of the first pixel region 105-1 and the second OLED bottom structure 107-1b of the first pixel region 105-1, and the second via 108-2 connects the second OLED bottom structure 107-1b of the first pixel region 105-1 and the third OLED bottom structure 107-1c of the first pixel region 105-1. Thus, a first electrical path 220-1 is formed, connecting the first OLED bottom structure 107-1a, the second OLED bottom structure 107-1b, and the third OLED bottom structure 107-1c in series. The first electrical path is electrically connected between the complementary bit line (BLB) and the first memory cell 112-1.

Similarly, the fourth OLED bottom structure 107-2a of the second pixel region 105-2 is connected to a second access transistor m6 of the first memory cell 112-1, through the third routing connection 150-3. The sixth OLED bottom structure 107-2c of the second pixel region 105-2 is connected to the bit line (BL), through the fourth routing connection 150-4. Further, the third via 108-3 electrically connects the fourth OLED bottom structure 107-2a of the second pixel region 105-2 and the fifth OLED bottom structure 107-2b of the second pixel region 105-2, and the fourth via 108-4 electrically connects the fifth OLED bottom structure 107-2b of the second pixel region 105-2 and the sixth OLED bottom structure 107-2c of the second pixel region 105-2. Thus, a second electrical path 220-2 is formed, connecting the fourth OLED bottom structure 107-2a, the fifth OLED bottom structure 107-2b, and the sixth OLED bottom structure 107-2c in series. The second electrical path 220-2 is electrically connected between the bit line (BL) and the first memory cell 112-1.

During operation, voltage biases are applied to the word line (WL), the bit line (BL), and the complementary bit line (BLB), and anomalies of the electrical resistances for both the first electrical path 220-1 and the second electrical path 220-2 can be detected. The anomaly of the electrical resistance may be caused by a defective spot of various types, including but not limited to pattern mistake, pixel misalignment or mismatch, broken site, delamination, disconnection, void, and so on. The defective spot may be caused by, for example, a film formation process, a printing process, a deposition process, a coating process, a lithography operation including a resist coating process, an exposure process and a developing process (as resist pattern defects), an etching operation, and a planarization operation including a chemical mechanical polishing (CMP) process.

During operation, the memory cell 112 can be used to identify and determine the presence or absence of a single problematic or defective pixel region, if an anomaly of resistance of the electrical path 220 (e.g., the first electrical path 220-1 and the second electrical path 220-2) corresponding to the pixel region 105 is detected. As one example, if an electrical resistance of the electrical path 220-1 measured by the first memory cell 112-1 is higher than a pre-determined threshold level, at least one anomaly in the pixel region 105-1 may be indicated, and the location of the pixel region 105-1 having the anomaly can be identified. A person having ordinary skills in the art will appreciate various methods for measuring the resistance using the memory cell 112.

Figure 3A:
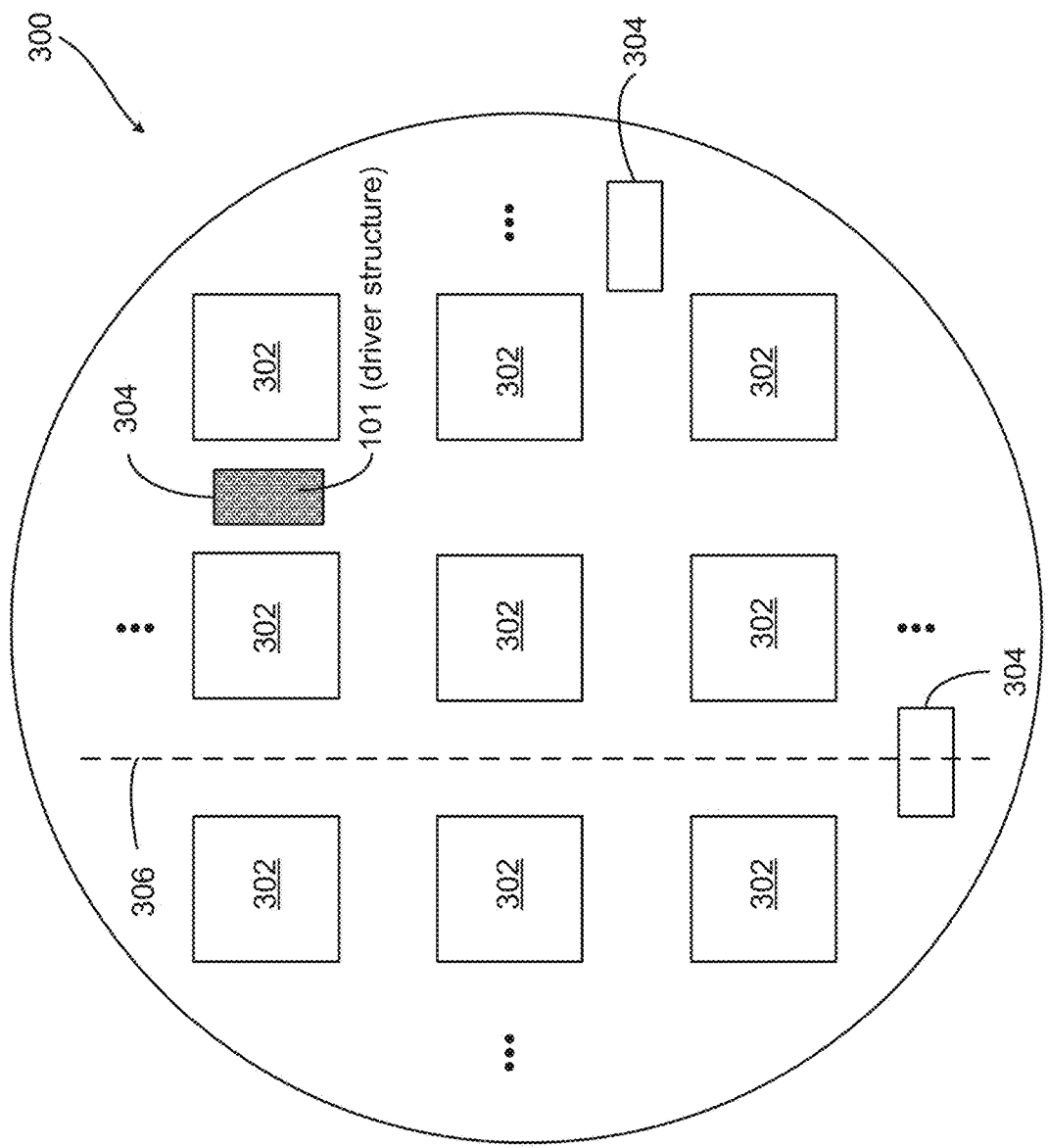
FIG. 3A is a schematic diagram illustrating a top view of an example wafer.
Figure 3B:
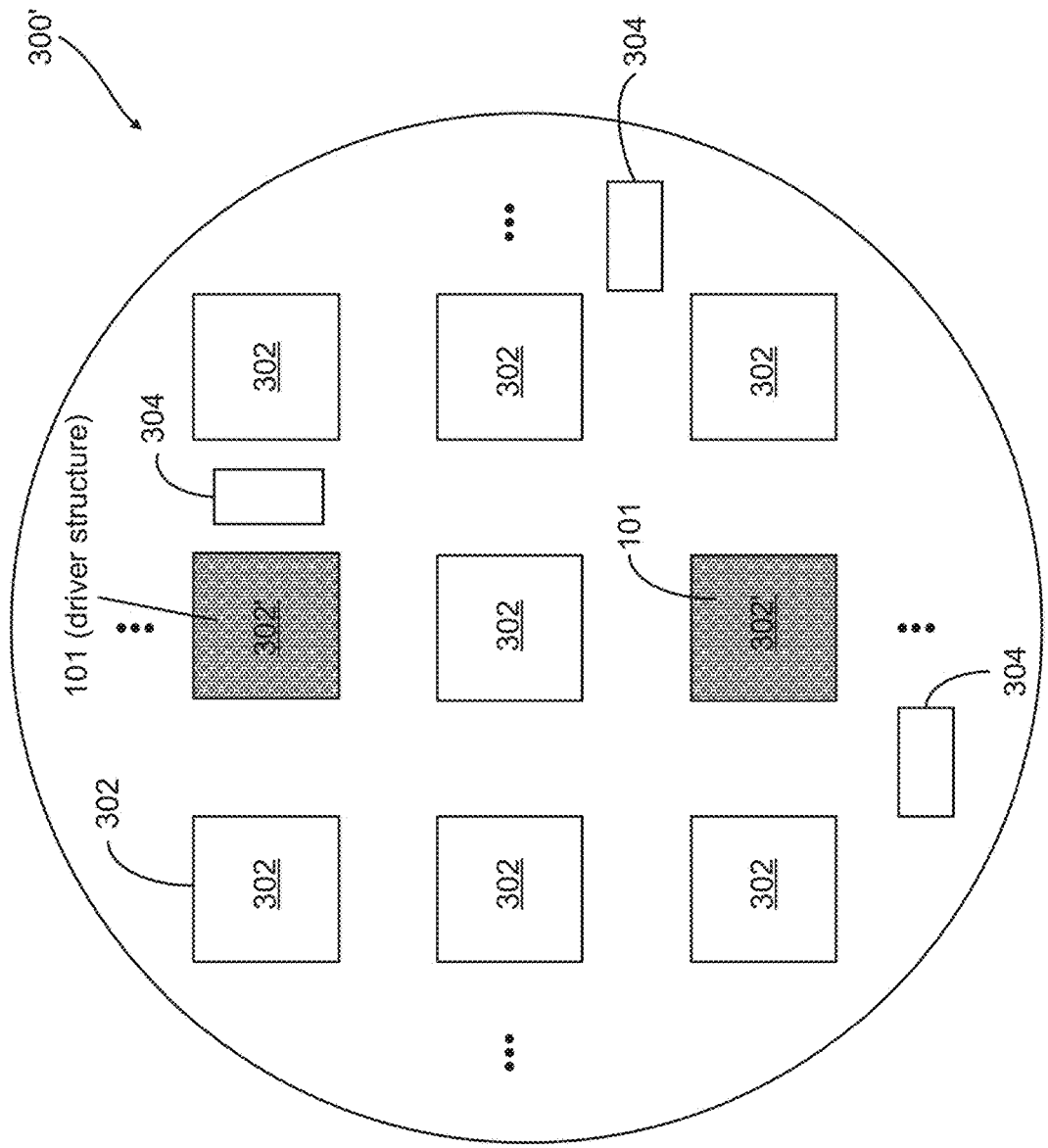
FIG. 3B is a schematic diagram illustrating a top view of another example wafer.

Now referring to FIGS. 3A and 3B, examples of implementation of the driver structure 101 in the manufacturing of OLED devices will be illustrated and described. FIG. 3A is a schematic diagram illustrating a top view of an example wafer 300. FIG. 3B is a schematic diagram illustrating a top view of another example wafer 300'. It should also be understood that FIGS. 3A and 3B are not drawn to scale.

In the illustrated example of FIG. 3A, the wafer 300 includes multiple production chip areas 302 and multiple PCMs 304. In some embodiments, the wafer is a silicon substrate, although other substrates may also be used. During a manufacturing operation, the OLED devices will be fabricated in the production chip areas 302, and the PCMs 304 will be used to monitor process qualities, control processes (e.g., feedback process), and/or detect process problems (anomalies, defects, etc.). In some embodiments, the PCM 304 is disposed in a scribe line 306 between two adjacent production chip areas 302. In other embodiments, the PCM 304 may be disposed within one of the production chip areas 302 or may replace a production chip area 302. In yet other embodiments, the wafer 300 includes only PCMs 304 in a matrix and thus the wafer 300 is a test wafer on which no OLED device is formed. The PCM 304 may be significantly smaller in dimension than a single production chip area 302. In operation, each of the PCMs 304 may be used to monitor the quality of the production chip areas 302 surrounding the corresponding PCM 304. The wafer 300 may include a sufficient number of PCMs 304 such that the entire production chip areas 302 can be monitored.

The driver structure 101 can be implemented directly into the PCMs 304. In some embodiments, at least one PCM 304 includes a driver structure 101. The driver structure 101 has a customer BEOL electrical checking structure 110 and multiple anomaly-detecting systems 200 as described above. Before the OLED major structure 120 is disposed onto the production chip areas 302, the systems 200 can be used to monitor and detect anomalies in every single pixel region 105. If no anomaly is detected by the systems 200 in the PCM 304, the quality of the production chip areas 302 surrounding the PCM 304 can be guaranteed. On the other hand, if an anomaly is detected by the systems 200 in the inspection chip areas 302', there is an indication of high risk for problematic or defective pixels in the production chip areas 302 surrounding the PCM 304. Thus, the quality of the OLED pixels can be monitored at a relatively early stage in the manufacturing process, which reduces further damages and significantly saves cost. In addition, because the PCM 304 includes a relatively small number of pixel regions, complete inspection of the entire wafer 300 using the systems 200 implemented in the PCMs 304 can be time-efficient.

The example wafer 300' shown in FIG. 3B is a close variation of the wafer 300. The wafer 300' includes multiple production chip areas 302 and at least one inspection chip area 302'. Products of OLED devices are fabricated in the production chip areas 302. The inspection chip areas 302' are selected as a representative portion of the total chip area of the wafer 300'. The number ratio of the production chip area 302 to the inspection chip area 302' may vary, e.g., from about 1000:1 to about 1:1. The driver structure 101 is implemented in the inspection chip areas 302'. Before the OLED major structure 120 is disposed onto the production chip areas 302, the systems 200 of the driver structure 101 can be used to monitor and detect anomalies in every single pixel region 105 in the inspection chip areas 302'. If no anomaly is detected by the systems 200 in the inspection chip areas 302', there is an indication of low risk for problematic or defective pixels in the production chip areas 302 surrounding the inspection chip areas 302'. On the other hand, if an anomaly is detected by the systems 200 in the inspection chip areas 302', there is an indication of a high risk for problematic or defective pixels in the production chip areas 302 surrounding the inspection chip area 302' or even the entire wafer 300'. In some embodiments, the driver structure 101 can be implemented in both the inspection chip areas 302' and the PCM 304. In some embodiments, the driver structure 101 can be implemented in the production chip area 302.

Example Method for Making Example Driver Structures and OLED Devices

Figure 4A:
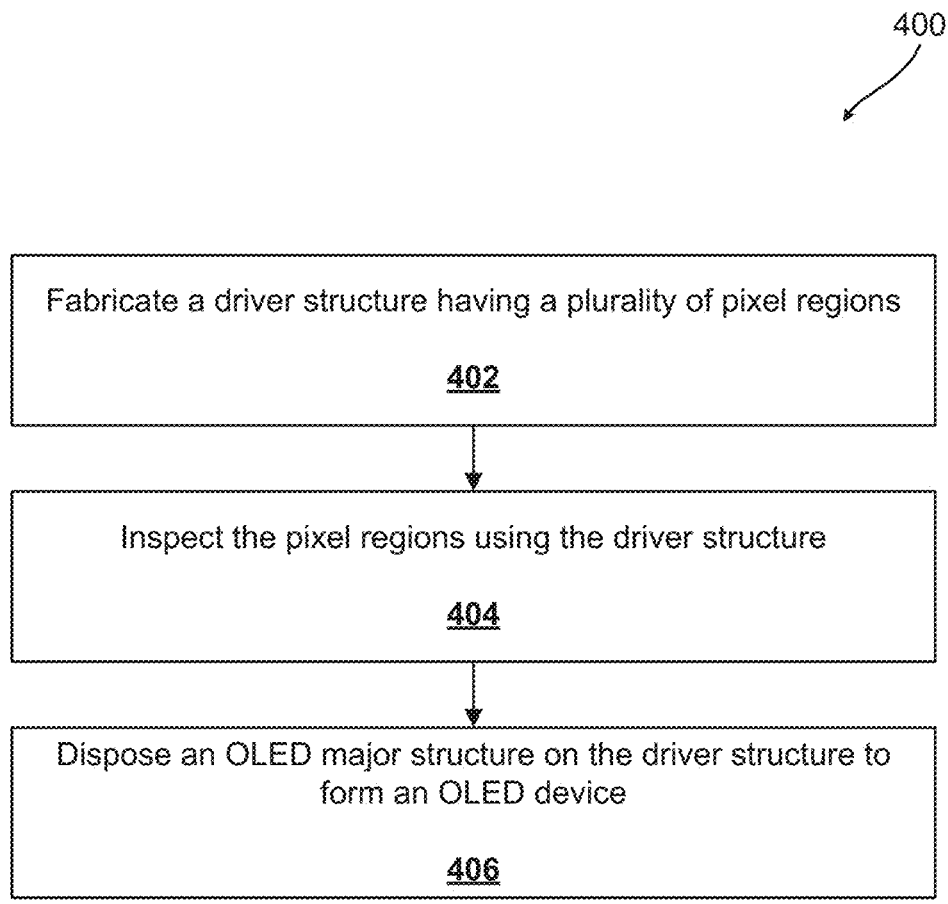
FIG. 4A is a flowchart diagram illustrating an example method in accordance with some embodiments.
Figure 4B:
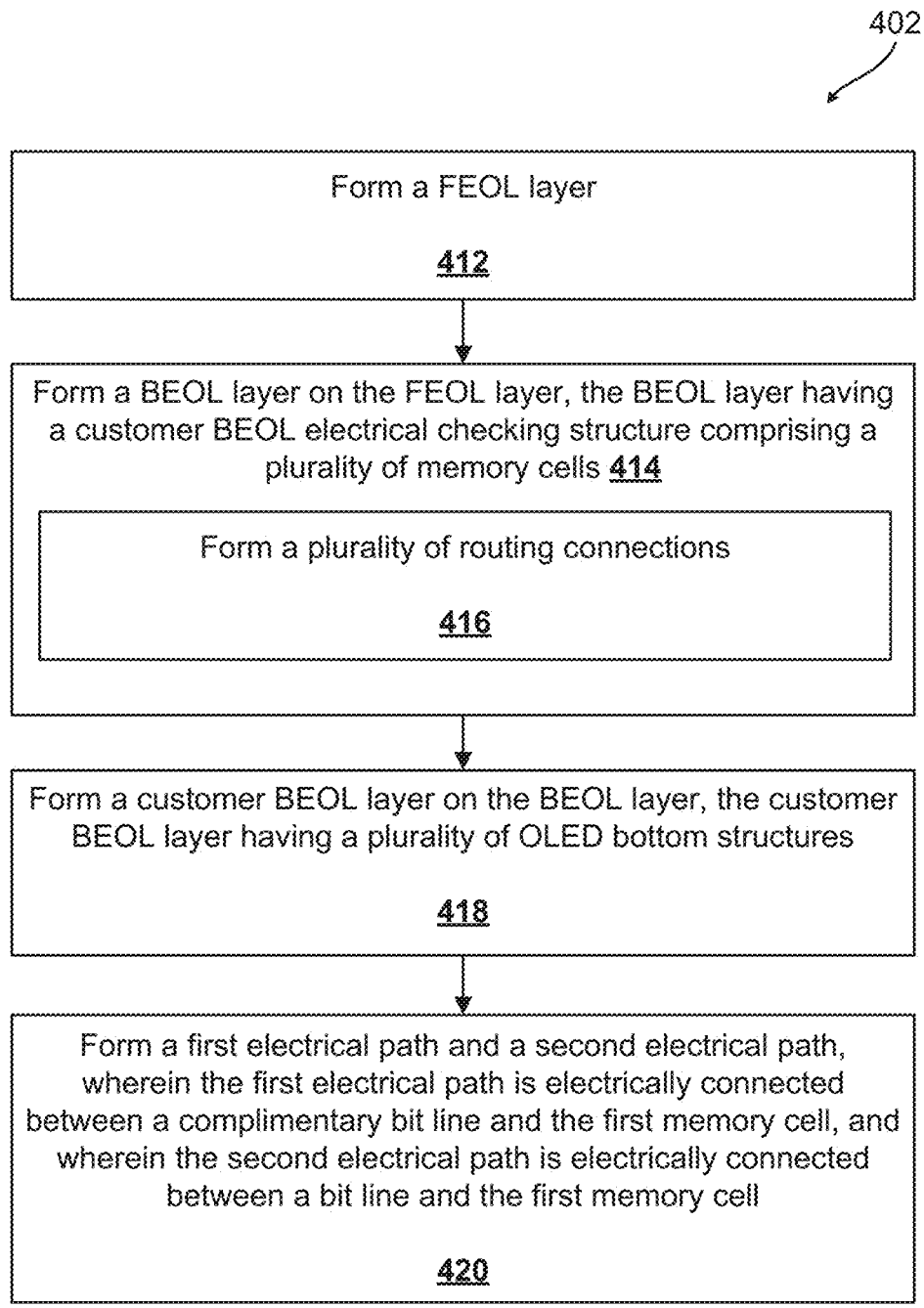
FIG. 4B is a flowchart diagram illustrating an example operation of the method of FIG. 4A in accordance with some embodiments.

Now referring to FIGS. 4A and 4B, example methods for making the driver structure and the OLED device according to the present disclosure will be illustrated and described. FIG. 4A is a flowchart diagram illustrating an example method 400 in accordance with some embodiments. FIG. 4B is a flowchart diagram illustrating an example operation of the method 400 in accordance with some embodiments.

In the illustrated example of FIG. 4A, the method 400 includes operations 402, 404, and 406. At operation 402, a driver structure 101 is fabricated. The driver structure can be fabricated during the manufacturing of OLED devices on a wafer. The driver structure can be disposed in a PCM or an inspection chip area (e.g., the PCM 304 or the inspection chip area 302' shown in FIGS. 3A-3B). The driver structure has multiple pixel regions 105 and multiple anomaly-detecting systems 200 corresponding to two adjacent pixel regions (e.g., 105-1 and 105-2) of the multiple pixel regions 105. An example operation 402 will be described below with reference to FIG. 4B.

At operation 404, the pixel regions are inspected using the driver structure and the anomaly-detecting systems thereof to detect an anomaly in the driver structure.

At operation 406, an OLED device 100 is formed by disposing an OLED major structure 120 on the driver structure 101. In some implementations, the driver structure implemented in the PCM or the inspection chip area is employed to determine the level of defective pixel regions for the entire production chip area in the wafer.

In the example shown in FIG. 4B, operation 402 may further includes operations 412, 414, 416, 418, and 420. At operation 412, a FEOL layer 102 is formed.

At operation 414, a BEOL layer is formed and disposed on the FEOL layer. In some implementations, a customer BEOL electrical checking structure 110 is formed in the BEOL layer. The customer BEOL electrical checking structure 110 includes the multiple memory cells 112, and each memory cell 112 is vertically aligned with and dimensionally comparable to two adjacent pixel regions.

In some implementations, operation 414 further includes operation 416. At operation 416, multiple routing connections 150 are formed in the BEOL layer. The routing connections 150 are electrically connected to the memory cells 112. As an example, four routing connections (150-1, 150-2, 150-3, and 150-4, as shown in FIG. 2) are electrically connected to the first memory cell 112-1.

At operation 418, a customer BEOL layer is formed and disposed on the BEOL layer. The customer BEOL layer has multiple OLED bottom structures 107 respectively disposed in the corresponding pixel regions 105 and electrically connected to the corresponding routing connections 150. As an example, three OLED bottom structures 107-1a, 107-1b, and 107-1c are disposed in the first pixel region 105-1, and three OLED bottom structures 107-2a, 107-2b, and 107-2c are disposed in the second pixel region 105-2. The OLED bottom structures 107-1a and 107-1c disposed in the first pixel region 105-1 are respectively connected to the first memory cell 112-1 through the routing connections 150-1 and 150-2. Similarly, the OLED bottom structures 107-2a and 107-2c disposed in the second pixel region 105-2 are respectively connected to the first memory cell 112-1 through the routing connections 150-3 and 150-4.

At operation 420, multiple electrical paths are formed to connect the three bottom structures of the corresponding pixel region in series. In some implementations, multiple vias 108 are formed to respectively interconnect the OLED bottom structures 107 of each pixel region 105. As an example, a first via 108-1 is formed to connect the OLED bottom structures 107-1a and 107-1b, and a second via 108-2 is formed to connect the OLED bottom structures 107-1b and 107-1c in the first pixel region 105-1, thereby forming a first electrical path 220-1. Similarly, a third via 108-3 is formed to connect the OLED bottom structures 107-2a and 107-2b, and a fourth via 108-4 is formed to connect the OLED bottom structures 107-2b and 107-2c in the second pixel region 105-2, thereby forming a second electrical path 220-2. As such, a first anomaly-detecting system is formed corresponding to the first memory cell 112-1 and the two adjacent pixel regions 105-1 and 105-2. Accordingly, multiple anomaly-detecting systems 200 can be formed in the driver structure 101.

Example Method for Inspecting Pixel Regions Using Example Driver Structures

Figure 5A:
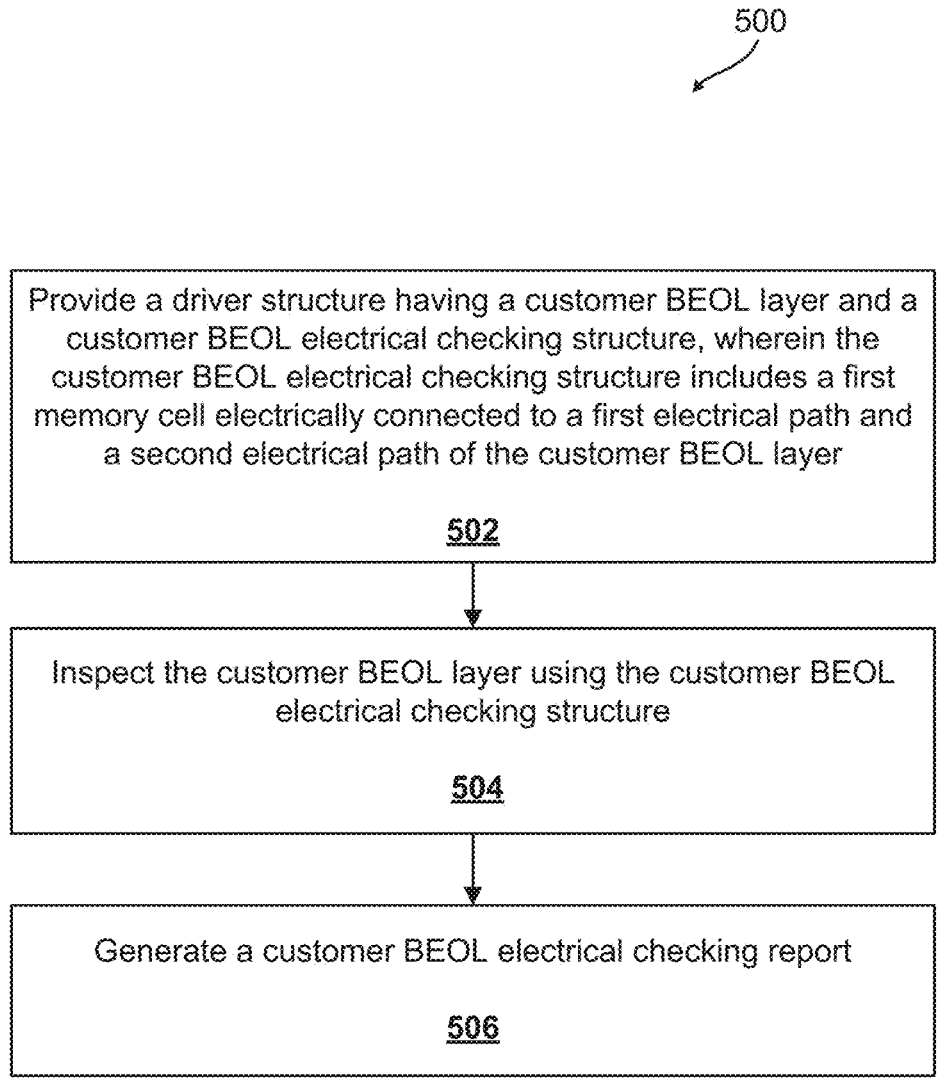
FIG. 5A is a flowchart diagram illustrating an example method in accordance with some embodiments.

FIG. 5A is a flowchart diagram illustrating an example method 500 in accordance with some embodiments. In the illustrated example, the method 500 includes operations 502, 504, and 506.

At operation 502, a driver structure 101 is provided. The driver structure can be fabricated by the implementation of, for example, the operation 402 shown in FIGS. 4A and 4B. The driver structure has a customer BEOL layer 104 and a customer BEOL electrical checking structure 110. The customer BEOL electrical checking structure 110 has multiple memory cells 112 that include a first memory cell 112-1. Each of the multiple memory cells 112 is aligned with and corresponding to two adjacent pixel regions 105-1 and 105-2. As discussed above, the driver structure has multiple anomaly-detecting systems 200 respectively corresponding to the memory cells 112.

Figure 5B:
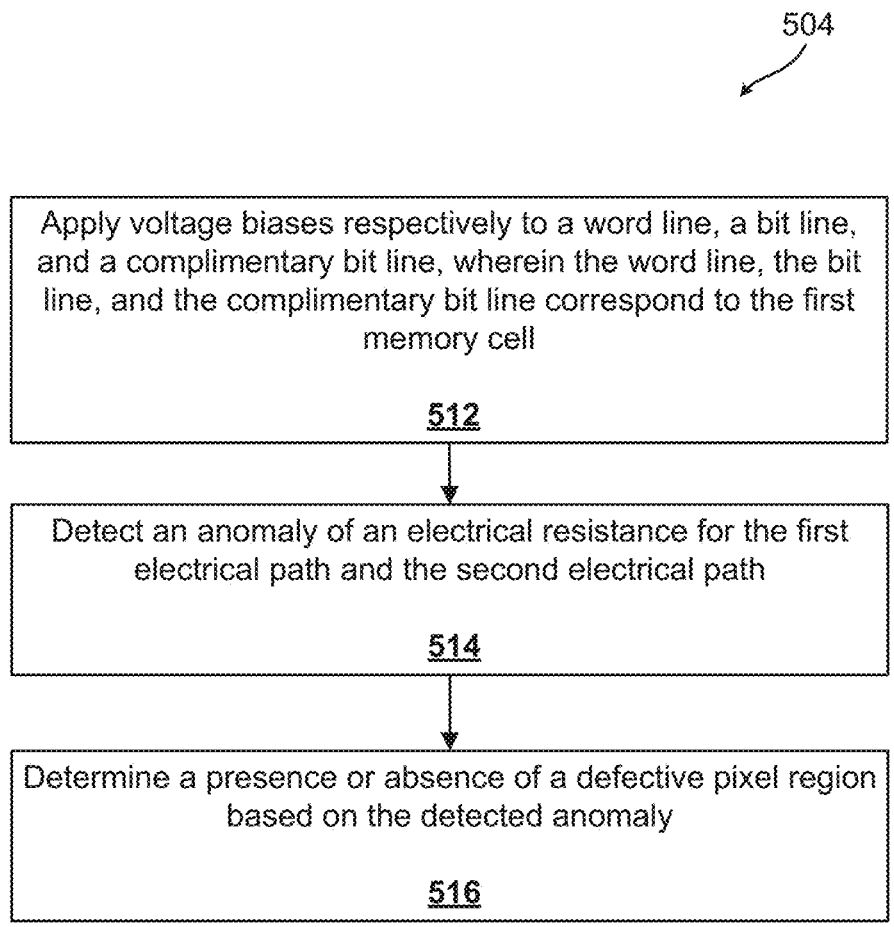
FIG. 5B is a flowchart diagram illustrating an example operation of the operation 504 of FIG. 5A in accordance with some embodiments.

At operation 504, the customer BEOL layer 104 is inspected using the customer BEOL electrical checking structure 110. FIG. 5B is a flowchart diagram illustrating an example of the operation 504 in accordance with some embodiments. As illustrated, the operation 504 further includes operations 512, 514, and 516.

At operation 512, voltage biases are respectively applied to a word line, a bit line, and a complementary bit line, wherein the word line, the bit line, and the complementary bit line correspond to each of the multiple memory cells (e.g., a first memory cell 112-1).

At operation 514, an anomaly of an electrical resistance respectively for the electrical paths 220-1 and 220-2 is detected. In some implementations, the anomaly of the electric resistance is detected during the process of writing data into the memory cells and reading data from the memory cells. In other implementations, the anomaly of the electric resistance is detected using automatic test equipment (ATE) based on algorithms such as the checkboard algorithm, the March algorithm, and the like. One of ordinary skill in the art would recognize other methods for detecting the anomaly of the electrical resistance.

At operation 516, the presence or absence of a defective pixel region in the two adjacent pixel regions 105-1 and 105-2 is determined based on the detected anomalies. In other words, a detected anomaly of the electrical resistance is associated with the presence of a defective pixel region. In some implementations, a portion or all of the pixel regions of the driver structure can be inspected by scanning the entire customer BEOL layer using the corresponding memory cells in the customer BEOL electrical checking structure. Accordingly, the number and location of the defective pixel regions of the driver structure can be identified based on the detected anomalies.

At operation 506, a customer BEOL electrical checking report is generated. In some implementations, the customer BEOL electrical checking report provides the number and location of the defective pixel regions as well as the overall defect rate. The customer BEOL electrical checking report can be generated at an early stage of the manufacturing of OLED devices, and the manufacturer can adjust the process flow based on the customer BEOL electrical checking report accordingly.

Summary

In accordance with some aspects of the disclosure, a driver structure for an organic light-emitting diode (OLED) device is provided. The driver structure has a plurality of pixel regions arranged in rows and columns and includes a front-end-of-line (FEOL) layer including a plurality of control transistors; a back-end-of-line (BEOL) layer disposed on the FEOL layer; and a customer BEOL layer disposed on the BEOL layer. The BEOL layer includes a multilayer interconnect (MLI) structure and a customer BEOL electrical checking structure. The customer BEOL electrical checking structure has a plurality of memory cells that include a first memory cell, and the first memory cell is vertically aligned with and corresponds to two adjacent pixel regions including a first pixel region and a second pixel region. The customer BEOL layer includes a plurality of OLED bottom structures, and the plurality of OLED bottom structures includes a first OLED bottom structure, a second OLED bottom structure, a third OLED bottom structure, a fourth OLED bottom structure, a fifth OLED bottom structure, and a sixth OLED bottom structure. The first OLED bottom structure, second OLED bottom structure, and third OLED bottom structure correspond to the first pixel region and are connected in series to form a first electrical path that is electrically connected to the first memory cell. The fourth OLED bottom structure, fifth OLED bottom structure, and sixth OLED bottom structure correspond to the second pixel region and are connected in series to form a second electrical path that is electrically connected to the first memory cell. Each of the OLED bottom structures corresponds to and is electrically connected to one of the plurality of control transistors through the MLI structure. The first memory cell is configured to detect an anomaly of the first electrical path and the second electrical path.

In accordance with some aspects of the disclosure, a method to form a driver structure having a plurality of pixel regions arranged in rows and columns for an organic light-emitting diode (OLED) device is provided. The method includes: (1) forming a front-end-of-line (FEOL) layer having a plurality of control transistors; (2) forming a back-end-of-line (BEOL) layer on the FEOL layer, wherein the BEOL layer includes a multilayer interconnect (MLI) structure and a customer BEOL electrical checking structure having a plurality of memory cells that include a first memory cell, wherein the first memory cell is vertically aligned with and corresponds to two adjacent pixel regions including a first pixel region and a second pixel region; (3) forming a plurality of routing connections in the BEOL layer; (4) forming a customer BEOL layer on the BEOL layer, wherein the customer BEOL layer includes a plurality of OLED bottom structures that include a first OLED bottom structure, a second OLED bottom structure, a third OLED bottom structure, a fourth OLED bottom structure, a fifth OLED bottom structure, and a sixth OLED bottom structure, wherein the first OLED bottom structure, second OLED bottom structure, and third OLED bottom structure correspond to the first pixel region, and the fourth OLED bottom structure, fifth OLED bottom structure, and sixth OLED bottom structure correspond to the second pixel region, and wherein each of the OLED bottom structures corresponds to and is electrically connected to one of the plurality of control transistors through the MLI structure; and (5) forming a first electrical path and a second electrical path, wherein the first electrical path connects the first OLED bottom structure, the second OLED bottom structure, and the third OLED bottom structure in series, wherein the second electrical path connects the fourth OLED bottom structure, the fifth OLED bottom structure, and the sixth OLED bottom structure in series, and wherein the plurality of routing connections are configured to connect the first electrical path to the first memory cell and to connect the second electrical path to the first memory cell.

In accordance with some aspects of the disclosure, a method is provided. The method includes: (1) providing a driver structure for an organic light-emitting diode (OLED) device, wherein the driver structure has a plurality of pixel regions arranged in rows and columns and includes: a front-end-of-line (FEOL) layer including a plurality of control transistors; a back-end-of-line (BEOL) layer disposed on the FEOL layer, wherein the BEOL layer includes: a multilayer interconnect (MLI) structure and a customer BEOL electrical checking structure having a plurality of memory cells that include a first memory cell, wherein the first memory cell is vertically aligned with and corresponds to two adjacent pixel regions including a first pixel region and a second pixel region; a customer BEOL layer disposed on the BEOL layer, wherein the customer BEOL layer include a plurality of OLED bottom structures that include: a first OLED bottom structure, a second OLED bottom structure, a third OLED bottom structure, a fourth OLED bottom structure, a fifth OLED bottom structure, and a sixth OLED bottom structure, wherein the first OLED bottom structure, second OLED bottom structure, and third OLED bottom structure correspond to the first pixel region, and the fourth OLED bottom structure, fifth OLED bottom structure, and sixth OLED bottom structure correspond to the second pixel region, wherein each of the OLED bottom structures corresponds to and is electrically connected to one of the plurality of control transistors through the MLI structure; and wherein the first memory cell is configured to detect an anomaly of the first electrical path and the second electrical path; and (2) inspecting the customer BEOL layer using the customer BEOL electrical checking structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A driver structure for an organic light-emitting diode (OLED) device, the driver structure having a plurality of pixel regions arranged in rows and columns, wherein the driver structure comprises:
    a front-end-of-line (FEOL) layer comprising a plurality of control transistors;
    a back-end-of-line (BEOL) layer disposed on the FEOL layer, wherein the BEOL layer comprises:
        a multilayer interconnect (MLI) structure; and
        a customer BEOL electrical checking structure having a plurality of memory cells that include a first memory cell, wherein the first memory cell is vertically aligned with and corresponds to two adjacent pixel regions comprising a first pixel region and a second pixel region; and
    a customer BEOL layer disposed on the BEOL layer, the customer BEOL layer comprising a plurality of OLED bottom structures, the plurality of OLED bottom structures comprising:
        a first OLED bottom structure, a second OLED bottom structure, and a third OLED bottom structure corresponding to the first pixel region and connected in series to form a first electrical path that is electrically connected to the first memory cell; and
        a fourth OLED bottom structure, a fifth OLED bottom structure, and a sixth OLED bottom structure corresponding to the second pixel region and connected in series to form a second electrical path that is electrically connected to the first memory cell;
    wherein each of the OLED bottom structures corresponds to and is electrically connected to one of the plurality of control transistors through the MLI structure; and
    wherein the first memory cell is configured to detect an anomaly of the first electrical path and the second electrical path.

2. The driver structure of claim 1, wherein each of the pixel regions further includes three sub-pixel regions, and wherein each of the plurality of OLED bottom structures corresponds to and is aligned with one of the sub-pixel regions.

3. The driver structure of claim 2, wherein the three sub-pixel regions correspond to a red color, a green color, and a blue color, respectively.

4. The driver structure of claim 1, wherein the first memory cell has a six-transistor (6T) static random access memory (SRAM) structure.

5. The driver structure of claim 4, wherein the first memory cell corresponds to a bit line, a complementary bit line, and a word line.

6. The driver structure of claim 5, wherein the first memory cell comprises a first access transistor and a second access transistor, and wherein the first access transistor and the second access transistor are electrically connected to the word line, respectively.

7. The driver structure of claim 6, wherein the first electrical path is electrically connected between the complementary bit line and the first memory cell, and wherein the second electrical path is electrically connected between the bit line and the first memory cell.

8. The driver structure of claim 7, wherein the first OLED bottom structure is electrically connected to the second OLED bottom structure through a first via, wherein the second OLED bottom structure is electrically connected to the third OLED bottom structure through a second via, wherein the first OLED bottom structure is electrically connected to the first access transistor through a first routing connection, and wherein the third OLED bottom structure is electrically connected to the complementary bit line through a second routing connection; and
wherein the fourth OLED bottom structure is electrically connected to the fifth OLED bottom structure through a third via, wherein the fifth OLED bottom structure is electrically connected to the sixth OLED bottom structure through a fourth via, wherein the fourth OLED bottom structure is electrically connected to the second access transistor through a third routing connection, and wherein the sixth OLED bottom structure is electrically connected to the bit line through a fourth routing connection.

9. The driver structure of claim 1, wherein the first memory cell is configured to detect an anomaly of an electrical resistance for the first electrical path and the second electrical path.

10. The driver structure of claim 2, wherein each of the plurality of control transistors corresponds to one of the sub-pixel regions and the corresponding OLED bottom structure located therein.

11. The driver structure of claim 1, wherein the MLI structure further comprises a plurality of metal layers, and wherein the first memory cell is located in two adjacent metal layers of the plurality of metal layers.

12. The driver structure of claim 1, wherein the driver structure is implemented in a process control module (PCM) of a wafer during manufacturing of the OLED device.

13. The driver structure of claim 1, wherein the driver structure is implemented in an inspection chip area of a wafer during manufacturing of the OLED device.

14. A method to form a driver structure for an organic light-emitting diode (OLED) device, the driver structure having a plurality of pixel regions arranged in rows and columns, wherein the method comprises:
forming a front-end-of-line (FEOL) layer having a plurality of control transistors;
forming a back-end-of-line (BEOL) layer on the FEOL layer, wherein the BEOL layer comprises:
a multilayer interconnect (MLI) structure; and
a customer BEOL electrical checking structure having a plurality of memory cells that include a first memory cell, wherein the first memory cell is vertically aligned with and corresponds to two adjacent pixel regions comprising a first pixel region and a second pixel region; and
forming a plurality of routing connections in the BEOL layer;
forming a customer BEOL layer on the BEOL layer, the customer BEOL layer comprising a plurality of OLED bottom structures, the plurality of OLED bottom structures comprising:
a first OLED bottom structure, a second OLED bottom structure, and a third OLED bottom structure corresponding to the first pixel region; and
a fourth OLED bottom structure, a fifth OLED bottom structure, and a sixth OLED bottom structure corresponding to the second pixel region;
wherein each of the OLED bottom structures corresponds to and is electrically connected to one of the plurality of control transistors through the MLI structure; and
forming a first electrical path and a second electrical path, wherein the first electrical path connects the first OLED bottom structure, the second OLED bottom structure, and the third OLED bottom structure in series, wherein the second electrical path connects the fourth OLED bottom structure, the fifth OLED bottom structure, and the sixth OLED bottom structure in series, and wherein the plurality of routing connections are configured to connect the first electrical path to the first memory cell and to connect the second electrical path to the first memory cell.

15. The method of claim 14, wherein forming the first electrical path and the second electrical path further comprises forming a plurality of vias having a first via, a second via, a third via, and a fourth via, wherein the first OLED bottom structure is electrically connected to the second OLED bottom structure through the first via, wherein the second OLED bottom structure is electrically connected to the third OLED bottom structure through the second via, wherein the fourth OLED bottom structure is electrically connected to the fifth OLED bottom structure through the third via, and wherein the fifth OLED bottom structure is electrically connected to the sixth OLED bottom structure through the fourth via.

16. The method of claim 14, wherein the first memory cell has a six-transistor (6T) static random access memory (SRAM) structure corresponding to a bit line, a complementary bit line, and a word line, wherein the first electrical path is electrically connected between the complementary bit line and the first memory cell, and wherein the second electrical path is electrically connected between the bit line and the first memory cell.

17. A method comprising:
providing a driver structure for an organic light-emitting diode (OLED) device, the driver structure having a plurality of pixel regions arranged in rows and columns, wherein the driver structure comprises:
a front-end-of-line (FEOL) layer comprising a plurality of control transistors;
a back-end-of-line (BEOL) layer disposed on the FEOL layer, wherein the BEOL layer comprises:
a multilayer interconnect (MLI) structure; and a customer BEOL electrical checking structure having a plurality of memory cells that include a first memory cell, wherein the first memory cell is vertically aligned with and corresponds to two adjacent pixel regions comprising a first pixel region and a second pixel region; and a customer BEOL layer disposed on the BEOL layer, the customer BEOL layer comprising a plurality of OLED bottom structures, the plurality of OLED bottom structures comprising:
- a first OLED bottom structure, a second OLED bottom structure, and a third OLED bottom structure corresponding to the first pixel region and connected in series to form a first electrical path that is electrically connected to the first memory cell; and
- a fourth OLED bottom structure, a fifth OLED bottom structure, and a sixth OLED bottom structure corresponding to the second pixel region and connected in series to form a second electrical path that is electrically connected to the first memory cell;

wherein each of the OLED bottom structures corresponds to and is electrically connected to one of the plurality of control transistors through the MLI structure; and wherein the first memory cell is configured to detect an anomaly of the first electrical path and the second electrical path; and inspecting the customer BEOL layer using the customer BEOL electrical checking structure.

18. The method of claim 17, wherein the first memory cell has a six-transistor (6T) static random access memory (SRAM) structure and corresponds to a bit line, a complementary bit line, and a word line, wherein the first electrical path is electrically connected between the complementary bit line and the first memory cell, and wherein the second electrical path is electrically connected between the bit line and the first memory cell, and wherein the method further comprises:
- applying voltage biases to the word line, the bit line, and the complementary bit line, respectively;
- detecting an anomaly of an electrical resistance of the first electrical path and the second electrical path; and
- determining a presence or absence of a defective pixel region based on the detected anomaly.

19. The method of claim 17, further comprising generating a customer BEOL electrical checking report.

20. The method of claim 17, wherein the customer BEOL layer is inspected before an OLED major structure is disposed on the customer BEOL layer.

* * * * *